(12) United States Patent
Tomita et al.

(10) Patent No.: US 6,399,422 B1
(45) Date of Patent: Jun. 4, 2002

(54) RADIATING PLATE STRUCTURE AND METHOD FOR MANUFACTURING SEMICONDUCTOR DEVICES USING THE SAME STRUCTURE

(75) Inventors: Yoshihiro Tomita; Hironori Matsushima, both of Tokyo; Hirofumi Makimoto, Kumamoto, all of (JP)

(73) Assignees: Mitsubishi Denki Kabushiki Kaisha; Mitsubishi Electric Kumamoto Semiconductor Corporation, both of (JP)

( * ) Notice: Subject to any disclaimer, the term of this patent is extended or adjusted under 35 U.S.C. 154(b) by 0 days.

(21) Appl. No.: 09/658,040

(22) Filed: Sep. 8, 2000

(30) Foreign Application Priority Data

Jan. 26, 2000 (JP) ........................................ 2000-017080

(51) Int. Cl.[7] .............................................. H01L 21/64
(52) U.S. Cl. ........................ 438/122; 438/106; 438/109; 438/121; 438/125; 438/127; 257/796; 257/675; 257/702; 257/706
(58) Field of Search ................................ 438/122, 106, 438/109, 121, 125, 127; 257/796, 675, 702, 706

(56) References Cited

U.S. PATENT DOCUMENTS

| 5,108,955 A | * | 4/1992 | Ishida et al. | |
| 5,266,834 A | * | 11/1993 | Nishi et al. | 257/706 |
| 5,619,070 A | * | 4/1997 | Kozono | 257/692 |
| 5,648,683 A | * | 7/1997 | Takahashi | 257/685 |
| 6,117,706 A | * | 9/2000 | Yoshioka et al. | 438/106 |

FOREIGN PATENT DOCUMENTS

| JP | 408330471 A | * | 12/1996 | H01L/23/12 |

* cited by examiner

*Primary Examiner*—Matthew Smith
*Assistant Examiner*—V. Yevsikov
(74) *Attorney, Agent, or Firm*—McDermott, Will & Emery

(57) ABSTRACT

A thermosetting epoxy adhesive 9 is applied at the end portion of one surface of the radiating plate 8 onto which a protection ring is bonded, and a protection tape 13 provided with projections 13a is pasted with the thermosetting epoxy adhesive 9 so that projections 13a may project to the opposite side of the radiating plate 8, to constitute the radiating plate structure 20 as one piece. And the radiating plate structures 20 are stacked within the magazine of the radiating plate mounting machine, each radiating plate structure 20 being picked up by the radiating plate mounting machine, its protection tape being peeled, the radiating plate 8 being mounted at a predetermined position.

4 Claims, 4 Drawing Sheets

RADIATING PLATE STRUCTURE AND METHOD FOR MANUFACTURING SEMICONDUCTOR DEVICES USING THE SAME STRUCTURE

BACKGROUND OF THE INVENTION

The present invention relates to a radiation plate structure which allows each radiating plate to be securely picked up from within a magazine of radiating plates stacked and mounted in a predetermined way in an automatic mounting process of the radiating plate for semiconductor devices, and a method for manufacturing semiconductor devices using the same structure.

At present, the manufacturing process of semiconductor devices is fully automated, and any trouble occurring in one step in a consecutive working process may stop the later steps, interfering with a manufacturing plan, giving rise to a severe problem. FIG. 5 is a cross-sectional view of a semiconductor device with radiating plate which is a Flip Chip BGA (Ball Grid Array) structure that has been conventionally manufactured, and FIGS. 6A to 6E are views showing a manufacturing process of the semiconductor device with radiating plate as shown in FIG. 5. In FIG. 5, reference numeral 1 represents a BGA substrate formed with a pattern of copper foil between multi glass layers (not shown) and hardened with epoxy resin, the pattern on one surface of the BGA substrate 1 and a terminal of an integrated circuit (not shown) for the semiconductor chip 2 being connected via a solder bump 3, and sealed by an under fill resin 4. And external electrodes 5 having a solder ball connected to the pattern are arranged in a matrix form on the other surface of the BGA substrate 1. Reference numeral 6 represents a protection ring attached by a thermosetting epoxy resin 7 on one surface of the BGA substrate 1, surrounding the semiconductor chip 2, and made of a metal such as copper, ceramic, or resin, the other surface of the protection ring 6 being bonded to a radiating plate 8 by a thermosetting epoxy adhesive 9, and the back face of the semiconductor chip 2 being bonded to the radiating plate 8 by a heat radiating resin 10 to constitute a semiconductor device 11 with radiating plate. And the heat produced within the semiconductor chip 2 and the BGA substrate 1 is transmitted via the radiating resin 10 to the radiating plate 7 and radiated to the outside.

In the semiconductor device 11 with radiating plate as above constituted, a task of attaching the radiating plate 8 to the semiconductor chip 2 is performed in such a way that the thermosetting epoxy adhesive 9 is applied on one surface of the radiating plate 8 where the protection ring 6 is bonded (FIG. 6A), the other adhesive face of the thermosetting epoxy adhesive 9 being pasted with a protection tape 12 of solid and flat shape which is made of polyethylene terephthalate film material (hereinafter referred to as a PET film material) which can be easily peeled off, to constitute a radiating plate structure 15 consisting of the radiating plate 8, the thermosetting epoxy adhesive 9 and the protection tape 12 as one piece, this radiating plate structure 15 being stacked successively within a magazine of an automatic mounting machine of radiating plate (not shown) (FIG. 6B), as shown in FIGS. 6A to 6E. On the other hand, the semiconductor chip 2 is attached on one surface of the BGA substrate 1 via the solder bump 3 and sealed by the underfill resin 4, and the protection ring 6 is attached by the thermosetting epoxy resin 7, surrounding the semiconductor chip 2, the radiating resin 10 being applied on the back face of the semiconductor chip 2 (FIG. 6C). And each radiating plate structure 15 within the magazine is picked up one by one by the automatic mounting machine of radiating plate, its protection tape 12 is peeled, and bonded to the semiconductor chip 2 and the protection ring 6 (FIG. 6D). Thereafter, the thermosetting epoxy adhesives 7, 9 and the radiating resin 10 are cured at 150° C. for four hours, and the external electrodes 5 are attached, to complete the manufacture of the semiconductor device 11 with radiating plate.

However, as seen from FIG. 7 which illustrates the occurrence of a malfunction in picking up the radiating plate, when the radiating plate structure 15a within the magazine is picked up by the automatic mounting machine of radiating plate, there occurs a phenomenon that the protection tape 12a is peeled and electrified, upon being separated from the radiating plate 8b of the radiating plate structure 15b directly below and joined together, to adsorb electrostatically the radiating plate 8b to lift the radiating plate structures 15a, 15b together, resulting in a problem that the radiating plate 8a can not be smoothly mounted to impede the productivity.

SUMMARY OF THE INVENTION

This invention has been achieved to resolve the aforementioned problems in the conventional example, and provides the radiating plate structure which allows to pick up securely the radiating plate one by one from within the magazine of the radiating plate mounting machine, and mount smoothly the radiating plate, in the automatic mounting process of the radiating plate for the semiconductor devices, and a method for manufacturing semiconductor devices using the same structure.

A radiating plate structure according to this invention, containing a radiating plate bonded on a protection member surrounding a semiconductor chip mounted on a substrate, comprises the radiating plate, an adhesive coated on a face of the radiating plate where the protective member is bonded, and a protection tape pasted with the adhesive, made of a material which can be easily peeled off this adhesive on which it is pasted and formed with a junction area reduction portion for reducing the junction area with the surface of a partner member to be joined on its non-pasted side.

Also, the junction area reduction portion is a projection which is projected on the non-pasted side of the protection tape to be pasted with the adhesive on the radiating plate.

Also, the junction area reduction portion is a through hole opened through the protection tape to be pasted with the adhesive on the radiating plate.

A method for manufacturing semiconductor devices according to this invention, a semiconductor device having a radiating plate bonded on a semiconductor chip mounted on a substrate and a protection member surrounding this semiconductor chip, includes a step of stacking the radiating, plate structure within a magazine of a radiating plate mounting machine, and a step of picking up each radiating plate structure stacked thereon, peeling its protection tape, and mounting the radiating plate at a predetermined position of the semiconductor device.

Also, the junction area reduction portion is a projection which is projected on the non-pasted side of the protection tape to be pasted with the adhesive on the radiating plate.

Also, the junction area reduction portion is a through hole opened through the protection tape to be pasted with the adhesive on the radiating plate.

Herein, the junction area reduction portion is a generic name encompassing the projection and the through hole.

DETAILED DESCRIPTION OF THE PREFERRED EMBODIMENTS

Embodiment 1

Figure 1:
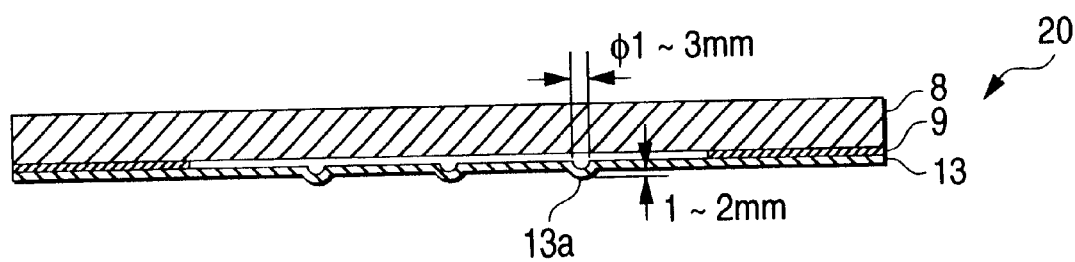
FIG. 1 is a cross-sectional view showing the state where a protection tape is pasted onto a radiating plate of a semiconductor device with radiating plate according to embodiment 1 of this invention.
Figure 2:
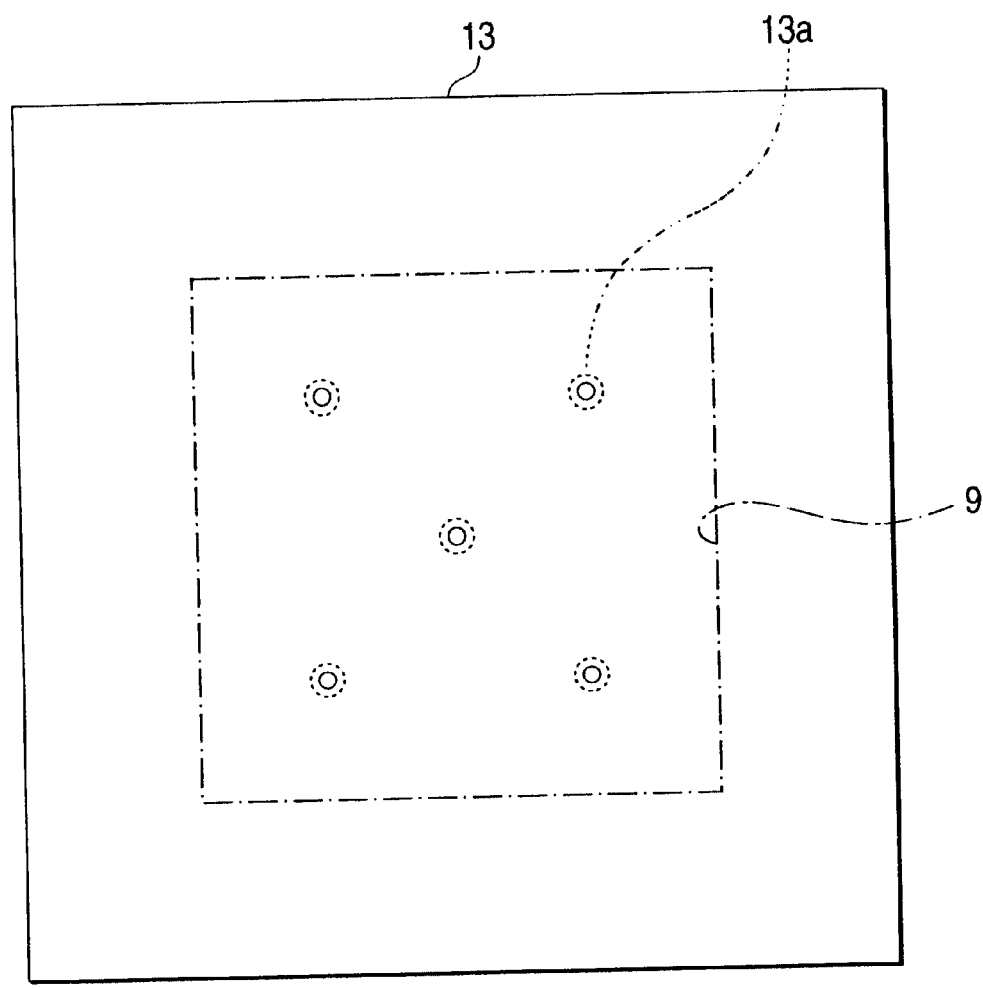
FIG. 2 is a plan view of the protection tape as shown in FIG. 1.
Figure 6A:
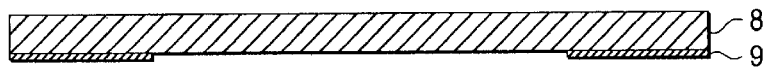
FIGS. 6A to 6E are views showing the process of manufacturing the semiconductor device with radiating plate as shown in FIG. 5.
Figure 6B:
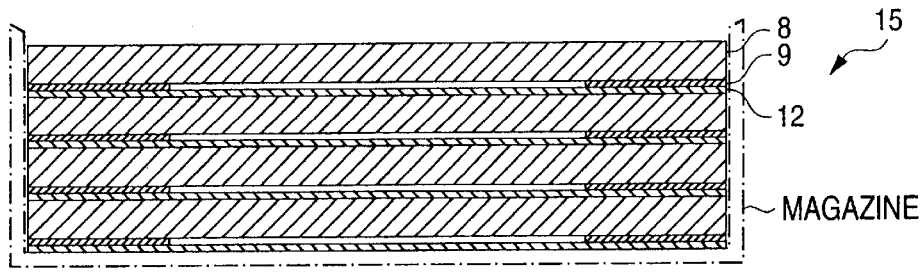
Figure 6C:
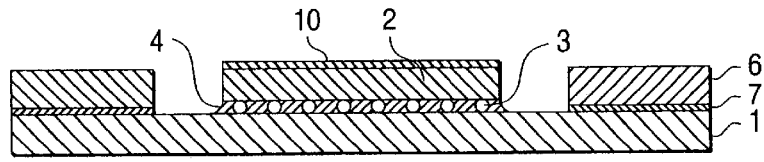
Figure 6D:
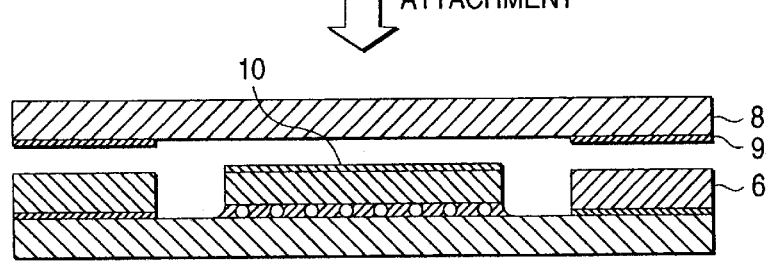
Figure 6E:
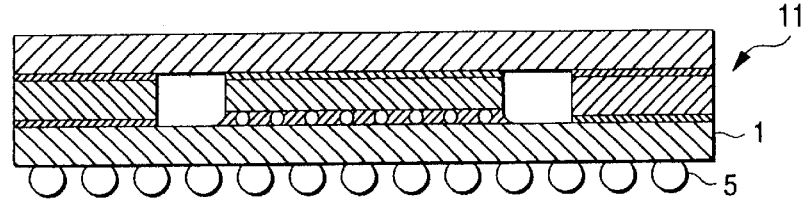
Figure 7:
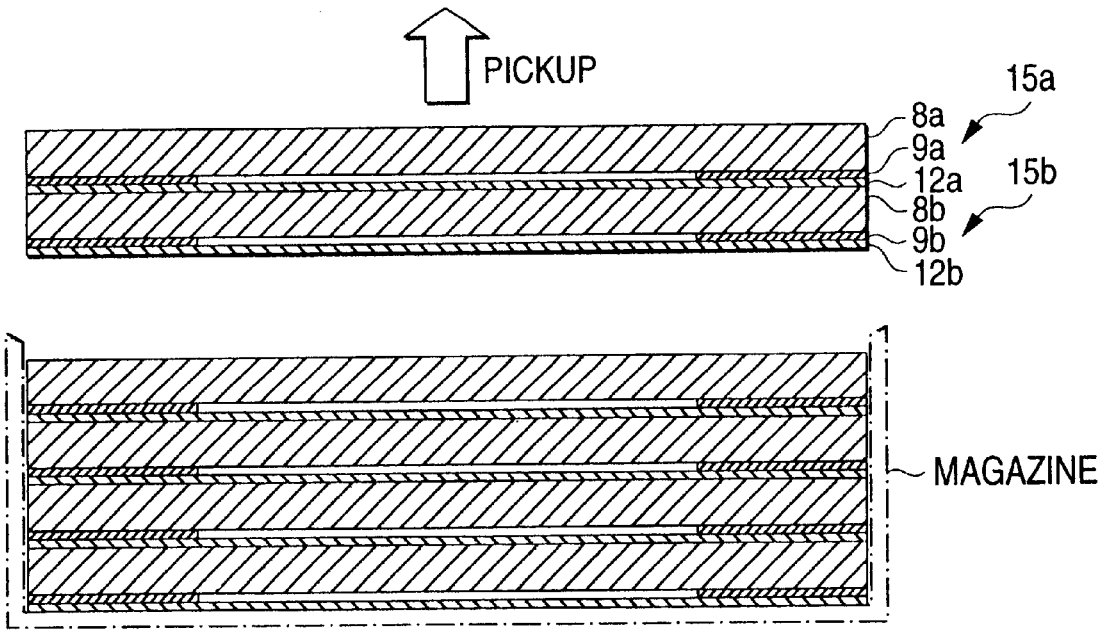
FIG. 7 is a view illustrating the occurrence of malfunction in picking up the conventional radiating plate.

A method of mounting a radiating plate for a semiconductor device with radiating plate according to one embodiment of the invention will be described below with reference to the drawings. FIG. 1 is a cross-sectional view showing the state where a protection tape is pasted on a radiating plate of the semiconductor device with radiating plate in one embodiment of this invention, and FIG. 2 is a plan view of the protection tape as shown in FIG. 1. In FIGS. 1 and 2, reference numeral 13 represents the protection tape made of a PET film material, formed with five projections 13a which project outside 1 to 2 mm high, with dents having a diameter of 1 to 3 mm, on the inner face of its central part, and pasted with a thermosetting epoxy adhesive 9, to constitute a radiating plate structure 20 consisting of the radiating plate 8, the thermosetting epoxy adhesive 9 and the protection tape 13 as one piece. And when the radiating plate-structure 20 is stacked within a magazine of an automatic mounting machine of radiating plate, each protection tape 13 is joined on the upper face of the radiating plate 8 directly below, like the conventional example as shown in FIG. 6B, but the top end of a projection 13a comes into contact with the upper face of the radiating plate 8 directly below, resulting in a quite small junction area.

And the radiating plate structure 20 as above constituted is stacked within the magazine of the automatic mounting machine of radiating plate. Then, if each radiating plate structure 20 is picked up, like the conventional example, in accordance with the process as shown in FIGS. 6A to 6E, the protection tape 13 is hardly electrified in picking up the radiating plate structure 20, because of a clearance corresponding to the projection height of 1 to 2 mm of the projection 13a between the lower face of the protection tape 13 and the upper face of the radiating plate 8 directly below, therefore the radiating plate 8 directly below being not adsorbed, so that only the radiating plate 8 to be mounted can be securely carried to allow for the smooth mounting operation.

While the projection 13a is provided in the central part of the protection tape 13 but not in the part of the radiating plate where the thermosetting epoxy adhesive 9 is applied, it should be noted that it may be provided on the part where the thermosetting epoxy adhesive is applied. In this case, however, the projection 13a should be formed balanced to four sides to obtain a secure clearance in stacking.

Embodiment 2

Figure 3:
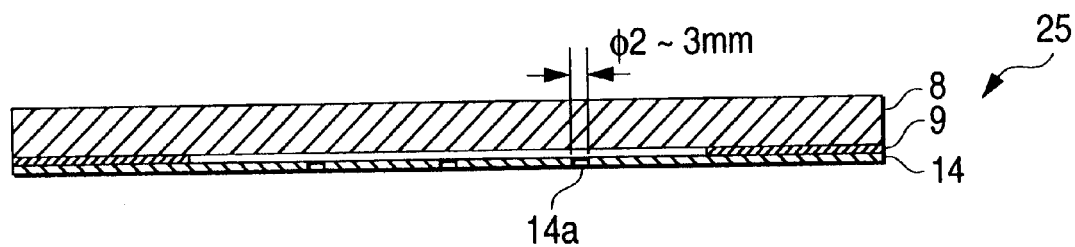
FIG. 3 is a cross-sectional view showing the state where a protection tape is pasted onto a radiating plate of a semiconductor device with radiating plate according to embodiment 2 of this invention.
Figure 4:
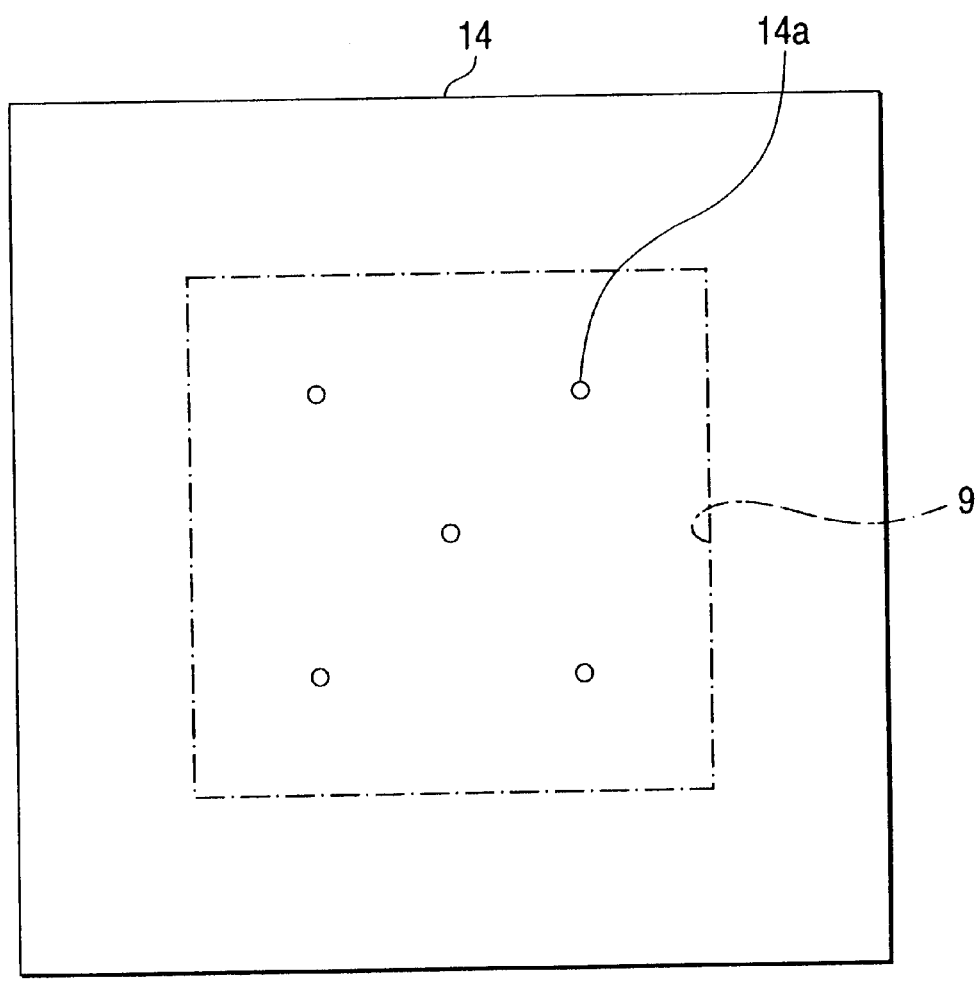
FIG. 4 is a plan view of the protection tape as shown in FIG. 3.
Figure 5:
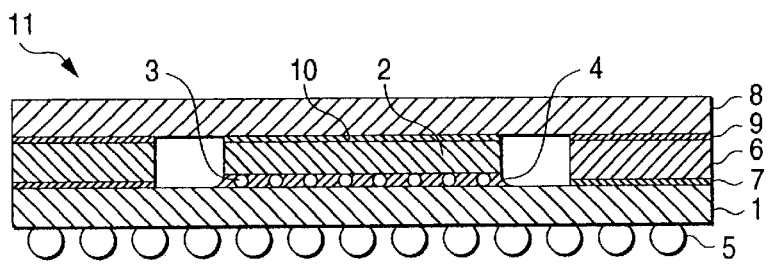
FIG. 5 is a cross-sectional view of a semiconductor device with radiating plate of Flip Chip BGA (Ball Grid Array) structure.

FIG. 3 is a cross-sectional view showing the state where a protection tape is pasted on a radiating plate of a semiconductor device with radiating plate according to embodiment 2 of this invention, and FIG. 4 is a plan view of the protection tape. In FIGS. 3 and 4, reference numeral 14 represents the protection tape made of a PET film material, having five through holes having a diameter $\phi$ of 2 to 3 mm opened in its central part and pasted with a thermosetting epoxy adhesive 9 to constitute a radiating plate structure 25 consisting of the radiating plate 8, the thermosetting epoxy adhesive 9 and the protection tape 13 as one piece. And when the radiating plate structure 25 is stacked within a magazine of an automatic mounting machine of radiating plate, each protection tape 14 is joined with the upper face of the radiating plate 8 directly below, like the conventional example as shown in FIG. 6B, but because of the existence of the through holes 14a, the junction area of the protection tape 14 onto the upper face of the radiating plate 8 is quite small.

While the through holes 14a are provided in the central part of the protection tape 14 but not in the part of the radiating plate where the thermosetting epoxy adhesive 9 is applied, it should be noted that it may be provided in the part where the thermosetting epoxy adhesive is applied, or one large through hole may be provided in the central part.

And if each radiating plate structure 25 as above constituted is stacked within the magazine and picked up in accordance with the process as shown in FIGS. 6A to 6E, like the conventional example, the junction area between the lower face of the protection tape 14 and the upper face of the radiating plate 8 directly below is decreased by the amount of five through holes 14a, and the amount of charge on the protection tape 13 is reduced in picking up each radiating plate structure 25, therefore the radiating plate structure 25 directly below being not adsorbed, so that only the radiating plate 8 to be mounted can be securely carried to effect the smooth mounting operation, in the same way as embodiment 1.

While in the above embodiments 1, 2, the protection ring 6 made of a material d different from that of the BGA substrate 1 is attached by the thermosetting epoxy adhesive 7, it should be noted that a portion of the same shape as the protection ring 6 maybe formed, using a thick substrate, and the radiating plate 8 may be bonded via the thermosetting epoxy adhesive 9 onto this protection member. The adhesive is not limited to the thermosetting epoxy adhesives 7, 9, but may be a thermoplastic epoxy adhesive. Further, it may be a so-called adhesive double-coated tape which has adhesive coated on both sides of tape. The substrate of the invention is not limited to the BGA substrate, but other substrates may be also applicable to the semiconductor devices.

This invention which is constituted as above described has the following effects.

The radiating plate structure comprises the radiating plate, the adhesive coated on the face of this radiating plate where the protective member is bonded, and the protection tape made of a material which can be easily peeled off this adhesive on which it is pasted, and formed with the junction area reduction portion for reducing the junction area with the surface of the partner member to be joined on its non-pasted side, whereby the electrostatic adsorption phenomenon which may occur in picking up each radiating plate structure stacked within the magazine of the radiating plate mounting machine can be prevented and each radiating plate structure can be securely picked up to allow for the smooth mounting of the radiating plate.

A method for manufacturing semiconductor devices includes a step of stacking each radiating plate structure within the magazine of the radiating plate mounting machine, and a step of picking up each radiating plate structure stacked thereon, peeling the protection tape, and mounting the radiating plate at a predetermined position, whereby each radiating plate structure can be securely picked up one by one without causing electrostatic adsorption between radiating plate structures stacked thereon, resulting in the smooth automatic mounting of the radiating plate at a predetermined position, without giving rise to any impediment such as delay in the progress of the manufacture process of semiconductor devices.

What is claimed is:

1. A radiating plate structure containing a radiating plate bonded on a protection member surrounding a semiconductor chip mounted on a substrate, said radiating plate structure comprising:

said radiating plate, an adhesive coated on a face of said radiating plate where said protection member is bonded, and a protection tape made of a material being easily peeled off said adhesive pasted thereon, and formed with a junction area reduction portion for reducing the junction area with the surface of a partner member to be joined on the non-pasted side thereof, said protection tape being pasted with said adhesive.

2. The radiating plate structure according to claim 1, wherein said junction area reduction portion is a projection which is projected on the non-pasted side of said protection tape to be pasted with said adhesive on said radiating plate.

3. The radiating plate structure according to claim 1, wherein said junction area reduction portion is a through hole opened through said protection tape to be pasted with said adhesive on said radiating plate.

4. A method for manufacturing semiconductor devices having a radiating plate bonded on a semiconductor chip mounted on a substrate and a protection member surrounding said semiconductor chip, said method comprising the steps of:

stacking a radiating plate structure according to claim 1, within a magazine of a radiating plate mounting machine, and picking up each of said radiating plate structures stacked, peeling said protection tape, and mounting the radiating plate at a predetermined position of a semiconductor device.

* * * * *